United States Patent [19]

Hsu

[11] Patent Number: 4,692,992

[45] Date of Patent: Sep. 15, 1987

[54] METHOD OF FORMING ISOLATION REGIONS IN A SEMICONDUCTOR DEVICE

[75] Inventor: Sheng T. Hsu, West Windsor Township, Mercer County, N.J.

[73] Assignee: RCA Corporation, Princeton, N.J.

[21] Appl. No.: 878,259

[22] Filed: Jun. 25, 1986

[51] Int. Cl.[4] .................. H01L 21/425; H01L 21/473
[52] U.S. Cl. .................................... 437/57; 437/67
[58] Field of Search ............... 29/576 W, 576 B, 571, 29/580; 148/187

[56] References Cited

U.S. PATENT DOCUMENTS

| | | | |
|---|---|---|---|
| 3,386,865 | 6/1968 | Doo | 148/175 |
| 3,920,482 | 11/1975 | Russell | 148/1.5 |
| 4,468,852 | 9/1984 | Cerofolini | 29/571 |
| 4,472,240 | 9/1984 | Kameyama | 156/648 |
| 4,495,025 | 1/1985 | Haskell | 29/576 W |
| 4,502,205 | 3/1985 | Yahano | 29/576 B |
| 4,523,369 | 6/1985 | Nagakubo | 29/576 W |
| 4,534,824 | 8/1985 | Chen | 156/628 |
| 4,538,343 | 9/1985 | Pollack et al. | 29/578 X |
| 4,570,325 | 2/1986 | Higuchi | 29/580 X |
| 4,574,467 | 3/1986 | Halfacre et al. | 29/571 |
| 4,584,027 | 4/1986 | Metz et al. | 148/187 X |
| 4,600,445 | 7/1986 | Horr et al. | 148/187 X |

OTHER PUBLICATIONS

"Trench Isolation with Boron Implanted Side-Walls for Controlling Narrow-Width Effect of n-MOS Threshold Voltages," 1985 Symposium on VLSI Technology, Digest of Technical Papers, Japanese Society of Applied Physics, May 14-16, 1985, Kobe, Japan, pp. 58-59.

Primary Examiner—George T. Ozaki
Attorney, Agent, or Firm—Allen LeRoy Limberg; Bernard F. Plantz

[57] ABSTRACT

A method of forming a semiconductor device is disclosed wherein the doping concentration of the side wall of a trench isolation region is increased. An opening is formed in a first masking layer so as to expose a portion of the semiconductor substrate. Then, dopants are introduced through the opening in the masking layer so as to form a heavily doped region within the semiconductor substrate. An isolation trench is then formed in the exposed portion of the semiconductor substrate. At least a portion of the side wall of the trench is located in the heavily doped region. The heavily doped region increases the threshold voltage of the side wall transistor and thereby reduces the leakage current along the side wall of the trench isolation region.

13 Claims, 13 Drawing Figures

METHOD OF FORMING ISOLATION REGIONS IN A SEMICONDUCTOR DEVICE

This invention relates to a method of forming isolation regions in a semiconductor device. More particularly, the present invention relates to a method of doping the side walls of an isolation region in a CMOS integrated circuit.

BACKGROUND OF THE INVENTION

A CMOS integrated circuit consists of an n-channel MOS transistor and a p-channel MOS transistor formed in and on the surface regions of a semiconductor substrate. The two transistors are typically isolated from each other by an insulating material, such as silicon dioxide. When the insulating material is present only on the surface of the substrate, a local oxidation of silicon (LOCOS) process is utilized to form the silicon dioxide layer. The active areas of the substrate containing the n-channel and p-channel transistors are masked with a layer of silicon nitride. The unmasked region of the substrate, between the active areas, is then oxidized to form the isolation region. However, during this oxidation process, the silicon dioxide propagates under the silicon nitride masking layer into the active area regions. This oxide propagation or "bird's beak" reduces the length of the active area region and increases the minimum distance between the p-channel and n-channel transistors. The LOCOS isolation process is not suitable for VLSI circuits because very high circuit densities cannot be achieved.

Trench isolation techniques can also be used to isolate the p-channel and n-channel transistors. In a typical trench isolation process, a trench is etched into the substrate between the two transistors. Then, the side walls of the trench are oxidized before the remainder of the trench is filled with a dielectric material, such as chemically vapor deposited silicon dioxide. The trench isolation process is more suitable for VLSI circuits because it reduces the minimum distance between the n-channel and p-channel transistors.

Isolation regions can also be formed in the field areas of the device using a buried oxide (BOX) process. A trench is first formed in the field areas of the substrate. Then, the walls of the trench are thermally oxidized before an insulating material is used to fill the trench. As in the trench isolation process, the insulating material may be chemically vapor deposited silicon dioxide. In the BOX process, the trenches are generally not as deep as the trenches utilized in a CMOS device to isolate the p-channel and n-channel transistors.

In both the trench isolation technique and the BOX process, there is a problem of positive charges forming on the walls of the trench at the interface with the silicon dioxide layer. The doping concentration at the vertical side wall is dependent on the doping concentration of the adjacent n- or p- silicon substrate or well. If the side wall is lightly doped p-type silicon, the interface positive charge could be sufficient to cause inversion along the wall of the trench. In order to overcome this problem, it has been proposed to increase the doping concentration at the side wall so as to increase the side wall threshold voltage. One such technique has been proposed by G. Fuse et al. in the article entitled "Trench Isolation With Boron Implanted Side-Walls for Contolling Narrow-Width Effect of n-Mos Threshold Voltages," 1985 Symposium on VLSI Technology, Digest of Technical Papers Japan Society of Applied Physics, May 14–16, 1985, pp. 58–9. The trenches are first etched into the silicon substrate using a reactive ion etching technique. Then, the silicon substrate is rotated while boron atoms are implanted into each side wall using an implantation angle of 0° and 8°. This technique is not suitable for CMOS devices because the implantation process is not selective. The side wall adjacent the n-well or n-substrate in the CMOS device would be implanted with the boron atoms.

SUMMARY OF THE INVENTION

A method of making a semiconductor device by first providing a semiconductor substrate with abutting regions of a first and second conductivity type which extend to the surface of the substrate. In at least one of the abutting regions, a heavily doped region of the same conductivity type is formed adjacent the interface with the other abutting region. A trench is then formed in the substrate by removing portions of said substrate. The trench has at least a wall portion which extends along the heavily doped region.

DETAILED DESCRIPTION OF THE PREFERRED EMBODIMENT

Referring to FIGS. 1–6, the method of the present invention will be described for forming a trench isolation region between the NMOS and PMOS transistors in an n-well CMOS integrated circuit.

Figure 1:
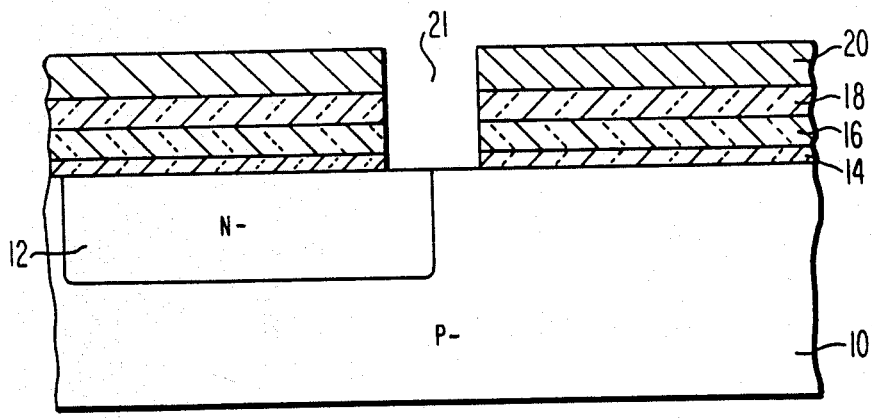
FIGS. 1–6 are sectional views of a CMOS device illustrating the steps of the method of the present invention for forming a trench isolation region between the NMOS and PMOS transistors.

As shown in FIG. 1, the method of the present invention begins with a semiconductor substrate 10, such as lightly doped p-type single crystalline silicon. A lightly doped n-well 12 is formed in the substrate 10 using conventional techniques. Alternatively, the substrate 10 may include a p-type epitaxial silicon layer in which the n-well is formed. Then, a pad oxide layer 14 is formed on the surface of the silicon substrate 10. The pad oxide layer 14 is typically grown to a thickness of about 10–40 nm by heating the substrate 10 to a temperature of about 800° C. in an oxygen atmosphere containing about 10% steam. A silicon nitride layer 16 is then formed on the pad oxide layer 14. The silicon nitride layer 16 is typically deposited by reacting silane or a silicon halide with ammonia at a temperature of about 700°–800° C. The silicon nitride layer 16 has a thickness of about 150–400 nm. A second silicon dioxide layer 18 is deposited on the silicon nitride layer 16. The second silicon dioxide layer 18 is formed using conventional chemical vapor deposition techniques, such as reacting silane with oxygen at a temperature on the order of about 300°–500° C.

The silicon nitride layer 16 and the second silicon dioxide layer 18 serve as a first masking layer to protect portions of the substrate 10 and n-well 12 from the dopants which will be introduced into the side wall of the trench. Therefore, the total thickness of the silicon nitride layer 16 and the silicon dioxide layer 18 should be greater than or equal to the depth of the heavily doped region which is later formed. Typically, in a CMOS integrated circuit, the trench depth between the NMOS and the PMOS transistors is on the order of about 500–4000 nm. Therefore, the thickness of the second silicon dioxide layer 18 will range from about 100–850 nm.

A first photoresist layer 20 is then deposited over the second silicon dioxide layer 18. This first photoresist layer 20 is patterned, using conventional photolithographic techniques, so as to form an opening 21 over at least a portion of the interface between the abutting n-well 12 and the p-type silicon substrate 10. As shown in FIG. 1, the opening 21 typically has a width on the order of about 1000–2000 nm which corresponds to the width of the trench which is later formed. The portions of the second silicon dioxide layer 18, the silicon nitride layer 16 and the pad oxide layer 14 subtended by the opening 21 in the first photoresist layer 20 are removed using conventional plasma etching techniques. This etching operation extends the opening 21 through the second silicon dioxide layer 18, the silicon nitride layer 16 and the pad oxide layer 14 to expose a portion of the interface between the abutting regions of a first and second conductivity type, namely, the n-well 12 and the p-type silicon substrate 10. The first photoresist layer 20 is then removed using a conventional solvent.

Figure 2:
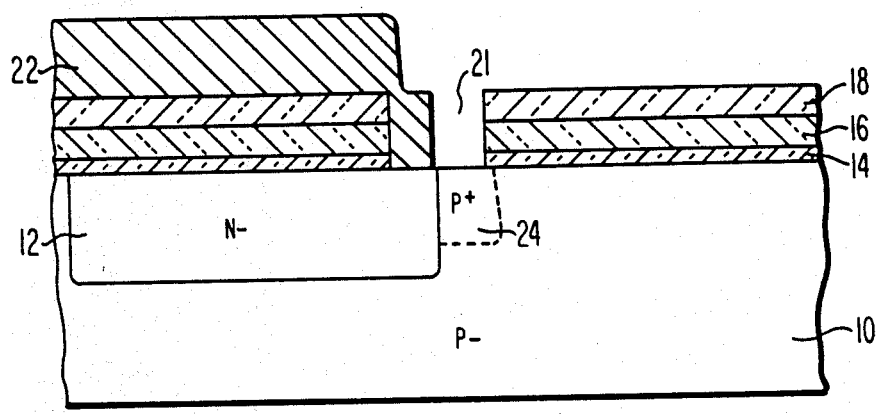
Figure 3:
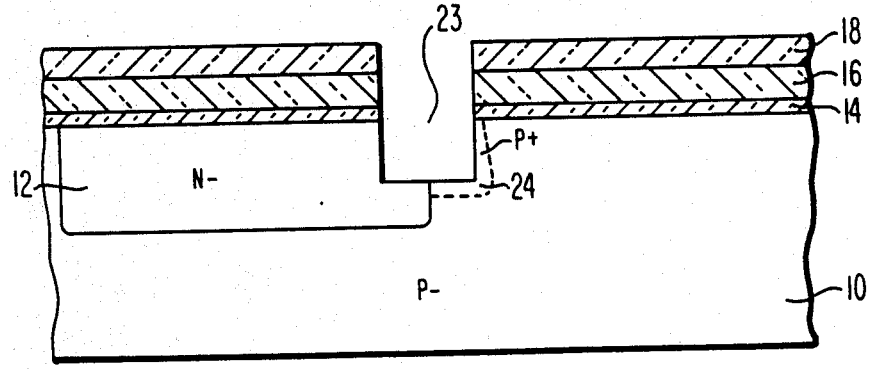

A second photoresist layer 22 is applied over the structure shown in FIG. 1. The second photoresist layer 22 is then patterned, using standard photolithographic techniques, so that at least a substantial portion of the n-well 12 is covered. As shown in FIG. 2, the second photoresist layer 22 acts as a second masking layer to prevent the portions of the n-well 12 within the opening 21 from being implanted during the subsequent doping operation.

As shown in FIG. 2, a p+ region 24 is formed in the p− region of the substrate 10 using multiple ion beam implants of a p-type dopant, such as boron. The ion dose and implant energy are selected so that the portion of the p− substrate 10 where the vertical wall of the trench is to be located has a substantially uniform implanted ion density. The implanted ion density along the axis of incidence can be approximated as a Gaussian distribution; therefore, $$N(x) = N_{MAX} \exp \frac{-(x - R_p)^2}{2(\Delta R_p)^2}$$

where:
  $N(x)$ = implanted ion density along the axis of incidence;
  $N_{MAX}$ = maximum implanted ion density;
  $x$ = distance parallel to the axis of incidence;
  $R_p$ = projected range, distance along the axis of incidence where the maximum implanted ion density ($N_{MAX}$) occurs; and
  $\Delta R_p$ = projected straggle, statistical fluctuations in the projected range along the axis of incidence.
The implanted ion density along an axis perpendicular to the axis of incidence is also approximated as a Gaussian distribution; therefore, $$N(y) = N(x) \exp \frac{-y^2}{2(\Delta R_{pt})^2}$$

where:
  $N(y)$ = implanted ion density along an axis perpendicular to the axis of incidence;
  $N(x)$ = implanted ion density along the axis of incidence where the axis perpendicular to the axis of incidence intersects the axis of incidence;
  $y$ = distance perpendicular to the axis of incidence; and
  $\Delta R_{pt}$ = transverse straggle, statistical fluctuations of the projected range along an axis perpendicular to the axis of incidence.

The values of $R_p$, $\Delta R_p$ and $\Delta R_{pt}$ as a function of ion energy for a variety of dopants and substrates are readily available in the literature. See, e.g., J. E. Gibbons et al., *Projected Range Statistics, Semiconductors and Related Materials*, Dowden, Hutchinson & Ross, Stroudsburg, Pa., 1975, pp. 316. The maximum implanted ion density $N_{MAX}$, occurs where $x = R_p$ and is equal to:

$$N_{MAX} = \frac{N_{DOSE}}{\sqrt{2\pi} \, \Delta R_p}$$

where:

$N_{DOSE}$ = ion dose per unit area.

The ion density in the implanted substrate is equal to half of $N_{MAX}$ when $x = 1.18 \Delta R_p$. Thus, if the ion dose, is $N_{DOSE}$, is selected for each implant step, n, such that:

$$\sqrt{2\pi} \, N_{MAX} = \frac{N_{DOSE1}}{\Delta R_{p1}} = \frac{N_{DOSE2}}{\Delta R_{p2}} = \ldots = \quad (1)$$

$$\frac{N_{DOSEn-1}}{\Delta R_{pn-1}} = \frac{N_{DOSEn}}{\Delta R_{pn}}$$

and the implant energy is selected for each implant step, n, such that:

$$R_{pn} - R_{pn-1} = 1.18(\Delta R_{pn} + \Delta R_{pn-1}) \quad (2)$$

the doping density in the portion of the semiconductor substrate where the vertical wall of the trench is to be formed will be substantially uniform. For example, if an isolation trench having a depth of about 600 nm is to be formed in a silicon substrate with a uniform boron doping density along a vertical side wall of $1.0 \times 10^{18}/cm^3$, the implant sequence summarized in Table 1 is utilized.

TABLE 1

| Implant Step | Implant Energy | Implant Dose ($N_{DOSE}$) |
|---|---|---|
| 1 | 30 keV | $9.25 \times 10^{12}/cm^2$ |
| 2 | 65 keV | $1.50 \times 10^{13}/cm^2$ |
| 3 | 130 keV | $2.00 \times 10^{13}/cm^2$ |
| 4 | 220 keV | $2.50 \times 10^{13}/cm^2$ |

FIG. 2 illustrates that a portion of the p− silicon substrate 10 underneath the pad oxide 14 is also doped with the p-type dopant. This doping occurs because some of the ions which are implanted into the substrate 10 travel in a direction perpendicular to the axis of incidence. In the same manner, a portion of the n-well 12 underneath the second photoresist 22 would also be doped with the p-type conductivity modifier (not shown). However, this doped portion of the n-well 12 underneath the second photoresist 22 will be removed when the trench is formed in the substrate. The implanted region 24 has a depth which is greater than the depth of the isolation trench which is later formed. The second photoresist 22 is removed using a conventional solvent.

A conventional plasma etching technique is then utilized to form the trench 23 in the silicon substrate 10. (See FIG. 3.) The trench 23 will have dimensions which correspond to the opening 21 formed in the pad oxide layer 14, the silicon nitride layer 16 and the second silicon dioxide layer 18. The trench 23 has a depth which is less than the depth of the heavily doped region 24. A portion of the n-well 12 is sacrificed in this trench forming operation. The typical trench in a CMOS device has a depth of about 500-4000 nm and, more particularly, about 500-1000 nm. When using a conventional ion implantation machine with an incident angle of 7°, the process described above for forming the heavily doped region 24 cannot be used for trenches which have a depth greater than about 1000 nm. For deeper trenches, the alternative method described in FIGS. 7 and 8 must be utilized. The vertical side wall of the trench 23 in the p- portion of the silicon substrate 10 has a substantial uniform doping density. This increased doping density along the side wall increases the side wall threshold voltage and reduces the side wall leakage current.

The second silicon dioxide layer 18 is then removed using a conventional plasma etching process. The resulting structure is then heated to a temperature of about 1000°-1100° C. in a nitrogen atmosphere for approximately 10-30 minutes. This high temperature annealing removes many of the defects formed in the side and bottom walls of the trench 23 due to plasma etching. While maintaining the structure at the elevated temperature of about 1000°-1100° C., the nitrogen atmosphere is replaced with dry oxygen so as to grow a silicon dioxide layer 26 on the vertical side and bottom walls of the trench 23. (See FIG. 4.) The thermally grown silicon dioxide layer 26 typically has a thickness of about 10-50 nm. The thermally grown silicon dioxide layer 26 is used to passivate the vertical side walls and bottom surfaces of the trench 23. Additionally, since the oxidation step is carried out at high temperatures, e.g., 1000°-1100° C., the segregation of boron into the thermally grown silicon dioxide layer 26 is minimized. The silicon nitride layer 16 is then removed using conventional plasma or wet etching techniques.

Figure 5:
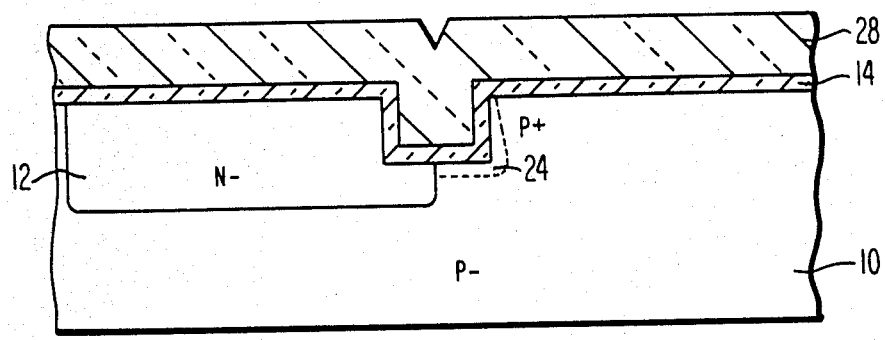

As shown in FIG. 5, a layer of silicon dioxide 28 is deposited within the trench and on the surfaces of the pad oxide layer 14. The silicon dioxide layer 28 is deposited using chemical vapor deposition techniques, such as reacting silane and oxygen at temperatures on the order of about 300°-500° C. The silicon dioxide layer 28 has a thickness which is at least as great as the depth of the trench. After the silicon dioxide deposition step, the silicon dioxide layer 28 is planarized using conventional plasma etching techniques.

Figure 6:
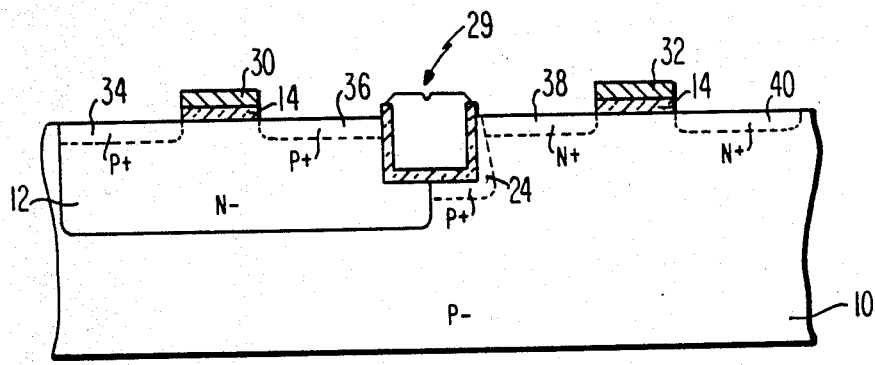

As shown in FIG. 6, a trench isolation region 29, with a heavily doped side wall region 24, is formed between the n-channel and p-channel transistors. A conductive layer is deposited over the surface of the substrate 10 and patterned using conventional photolithographic techniques to form the gates 30 and 32. Using the gates 30 and 32 as masks, the self-aligned sources 34 and 38 and drains 36 and 40 are formed in both the n-well 12 and the p- portion of the silicon substrate 10. Conventional CMOS processing techniques are then utilized to complete the device.

Figure 7:
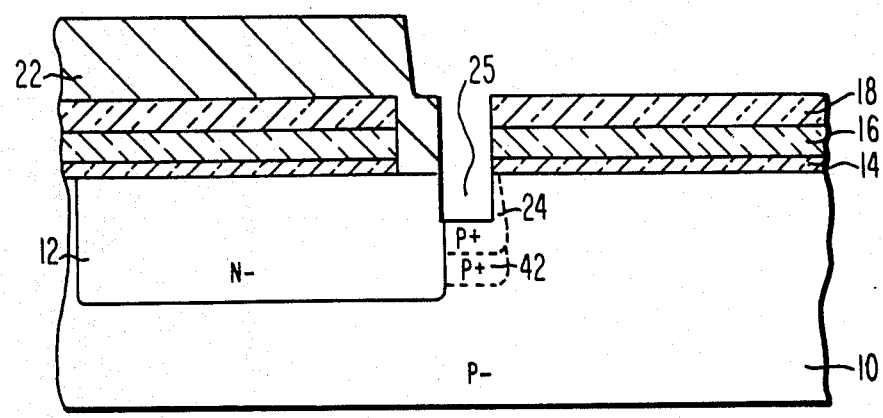
FIGS. 7 and 8 are sectional views of a CMOS device illustrating an alternative method to that shown in FIGS. 1–6.
Figure 8:
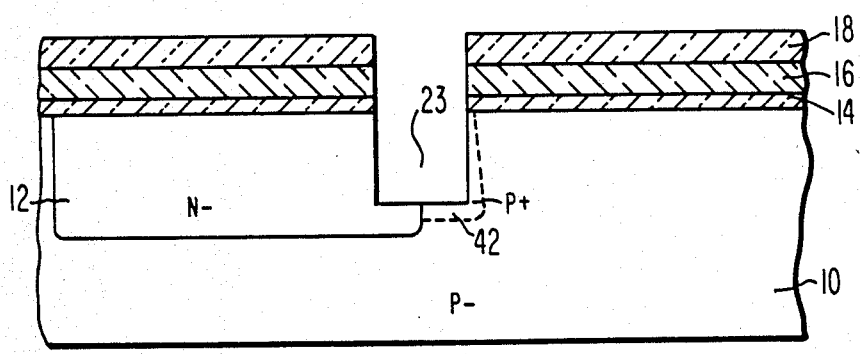

FIGS. 7 and 8 illustrate an alternative embodiment of the method of the present invention for forming trench isolation regions with a depth greater than about 1000 nm. When the trench depth is greater than about 1000 nm, an additional etching operation must be carried out after the step illustrated in FIG. 2. As shown in FIG. 7, the structure shown in FIG. 2 is etched using conventional plasma or wet etching techniques to form a trench 25 into the heavily doped region 24. The trench 25 is then subjected to a second ion implantation operation so as to form the deeper heavily doped region 42. The ion dose and implant energy are selected using equations (1) and (2) so that the side wall of the isolation trench 25 will have a uniform doping density. These additional etching and doping processes can be repeated as many times as required to dope the side wall to the desired depth. When a conventional ion implanter is utilized with an incident angle of 7°, the maximum side wall depth which can be doped with the method of FIGS. 7 and 8 is about 2000 nm. However, this limitation can be overcome by adjusting the incident angle of the ion implanter to zero. Then, there is no limitation on the depth of the side wall which can be heavily doped.

Figure 4:
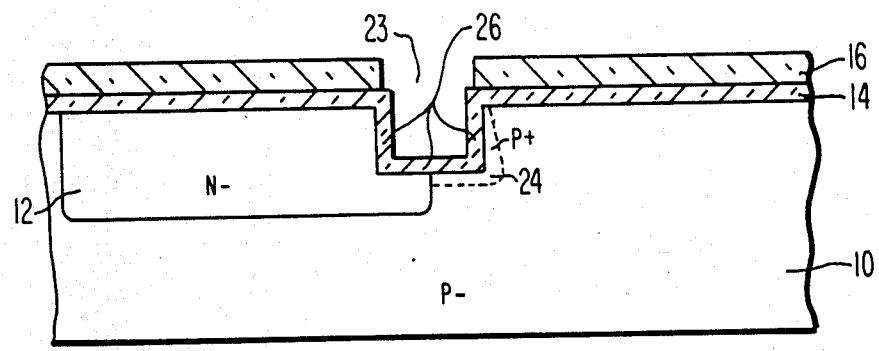

The second photoresist layer 22 is removed using a conventional solvent. As shown in FIG. 8, the larger trench 23 is formed between the n-well 12 and the p- portion of the substrate 10 using the technique described above for FIG. 3. The method illustrated in FIGS. 4-6 is then used to complete the device.

The method of FIGS. 1-8 can also be used to form isolation trenches in other devices, such as p-well and twin tub CMOS structures.

FIGS. 9-13 illustrate an alternative method of the present invention for forming a trench isolation region or BOX in the field areas of the substrate. The method of FIGS. 9-13 will be described for a twin tub CMOS device; however, the process is also applicable to an n-well or p-well CMOS structure.

Figure 9:
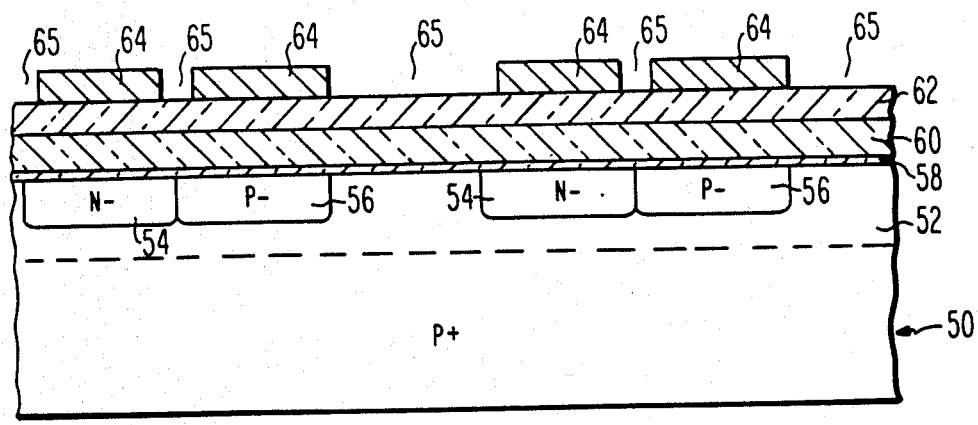
FIGS. 9–13 are sectional views of a CMOS device illustrating the method of the present invention for forming a buried oxide isolation region in the field areas.

As shown in FIG. 9, the method begins with a silicon semiconductor substrate 50 containing an epitaxial silicon layer 52. Alternatively, a semiconductor substrate 50 without the epitaxial silicon layer may be used. Then, n-wells 54 and p-wells 56 are formed in the epitaxial silicon layer 52 using conventional masking and ion implantation techniques. The active area is considered to include the abutting regions of a first and second conductivity type where the NMOS and PMOS transistors are formed along with any isolation means formed at the interface between the abutting regions.

A pad oxide layer 58, having a thickness of about 10-40 nm, is grown on the exposed surfaces of the epitaxial layer 52 and on the n-wells 54 and the p-wells 56. The conditions described for the formation of the pad oxide layer 14 in FIG. 1 are used to form the pad oxide layer 58 in FIG. 9. A silicon nitride layer 60, having a thickness of about 150-400 nm, is formed on the pad oxide layer 58 using the same techniques described for the silicon nitride layer 16 in FIG. 1. A second silicon dioxide layer 62 is then formed on the silicon nitride layer 60 using conventional chemical vapor deposition techniques. As described earlier with regard to FIG. 1, the total thickness of the silicon nitride layer 60 and the second silicon dioxide layer 62 will be greater than or equal to the depth of the heavily doped region. The silicon nitride layer 60 and the second silicon dioxide layer 62 function as a first masking layer to prevent portions of the active regions of the substrate from being implanted during the side wall doping operation. The trenches which are formed in the field regions of the device generally have a depth in a BOX process of about 500–1000 nm. Thus, the second silicon dioxide layer 62 has a thickness of about 100–850 nm.

A first photoresist layer is deposited on the second silicon dioxide layer 62 and patterned to form the first photoresist regions 64. As shown in FIG. 9, the openings 65 are formed in the photoresist which correspond to the portions of the substrate where the trenches are to be formed. The portions of the second silicon dioxide layer 62, the silicon nitride layer 60 and the pad oxide layer 58 which are not subtended by the photoresist regions 64 are removed using conventional plasma etching techniques. This etching operation extends the openings 65 through the second silicon dioxide layer 62, the silicon nitride layer 60 and the pad oxide layer 58. It should be noted that it may be desirable to form the trench isolation regions between the n-wells 54 and p-wells 56 in a separate step. In that case, the openings 65 would not be formed in the first photoresist, layer in the areas which overlie the interface of the n-wells 54 and the p-wells 56.

After the etching operation, the first photoresist regions 64 are removed. Then, a second photoresist 66 is deposited over the entire structure. This photoresist is then patterned so that at least a substantial portion of the exposed regions of the n-wells 54 are covered.

Figure 10:
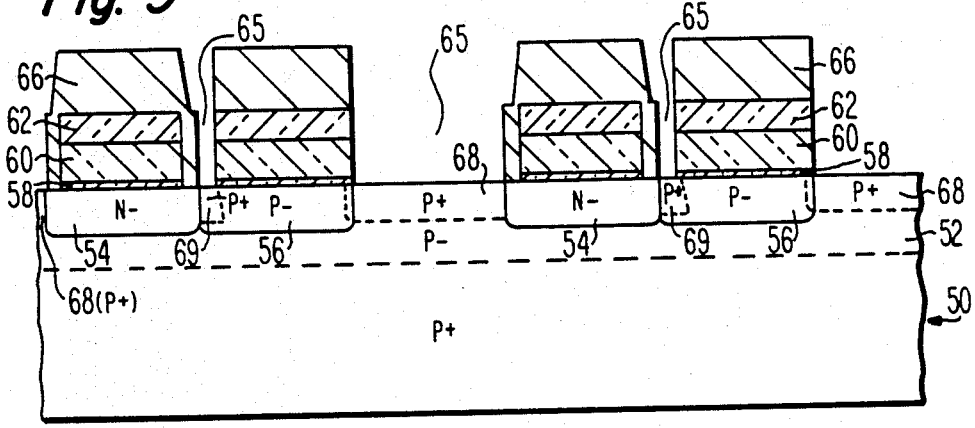

The multiple step ion implantation technique described for FIG. 2 is carried out. As shown in FIG. 10, the heavily doped regions 68 are formed in the field areas of the device. These heavily doped regions 68 extend into the portions of the p-wells 56 immediately adjacent the interface with the p- field areas. The heavily doped regions 69 are also formed in the portions of the p-wells 56 immediately adjacent the interface with the n-wells 54. These heavily doped regions 68 and 69 would typically have a depth of greater than about 500–1000 nm. The second photoresist layer 66 is then removed.

Figure 11:
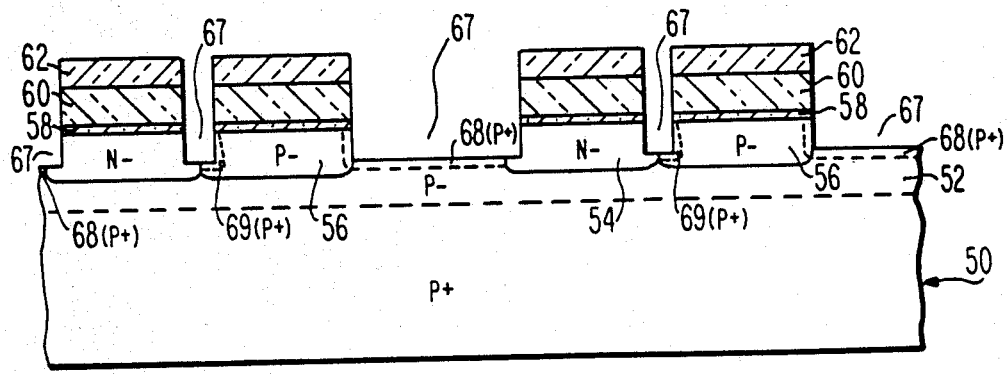
Figure 12:
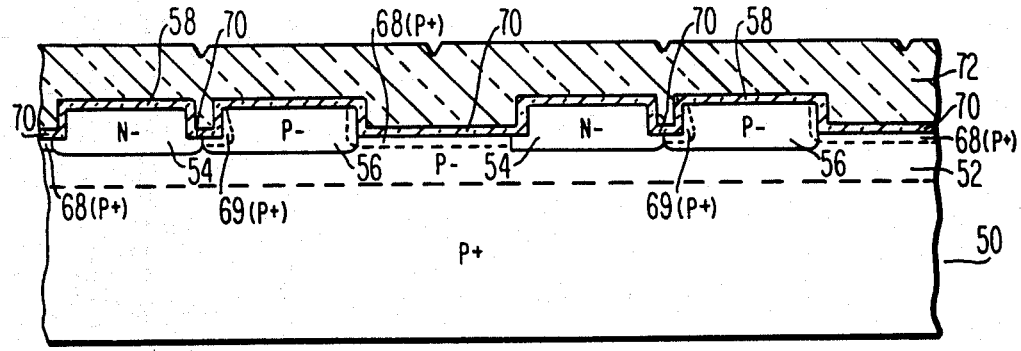

Using conventional plasma etching techniques, the trenches 67 are formed between the n-wells 54 and the p-wells 56 and in the field regions which surround the active areas. As shown in FIG. 11, the silicon nitride layer 60 and the second silicon dioxide layer 62 function as a first masking layer along with the pad oxide layer 58 to protect the portions of the n-wells 54 and p-wells 56 where the transistors are to be formed. FIG. 11 also illustrates that the vertical side walls of the trenches 67 in the p-well regions 56 are heavily doped with a p-type dopant.

The second silicon dioxide layer 62 is removed and the structure is annealed and oxidized using the conditions described above with regard to FIG. 4. A silicon dioxide layer 70, having a thickness of about 10–50 nm, is formed on the vertical side and bottom walls of the trenches (see FIG. 12). The entire structure is then coated with a silicon dioxide layer 72 using conventional chemical vapor depostion techniques. This deposition step fills the trenches in both the field areas and in the regions between the n-wells 54 and p-wells 56.

Figure 13:
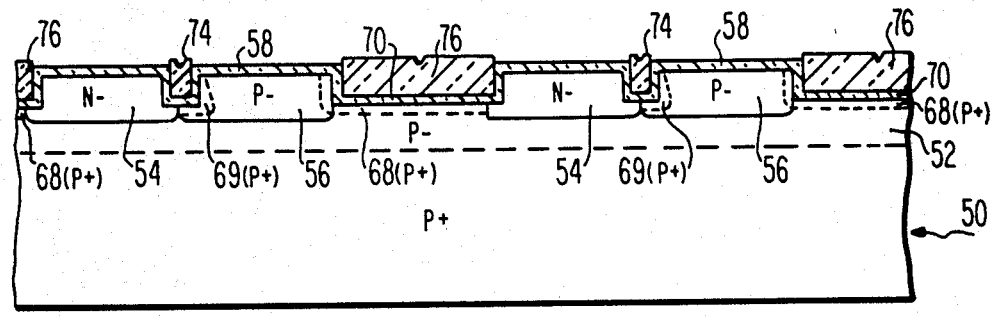

As shown in FIG. 13, the entire structure is then planarized so as to form the trench isolation regions 74 between the n-wells 54 and p-wells 56 along with the buried oxide isolation regions 76 in the field areas between the active CMOS devices. Conventional CMOS processing techniques are then utilized to form transistors in the n-wells 54 and p-wells 56.

The methods described above in FIGS. 1 to 13 have been used to increase the doping concentration of the trench side wall in the p region of the substrate. The same technique could also be used to increase the doping concentration of the vertical side wall in the n region of the substrate. In this case, a substantial portion of the p regions of the substrate would be covered with the second photoresist layer during the ion implantation process. Phosphorus or arsenic would be substituted for boron so as to form a heavily doped n-type region along the vertical side wall of the trench which is adjacent the n-type substrate material. In most CMOS applications, the inversion problem generally occurs along the p wall of the trench. Therefore, the doping of the vertical side wall in the n region is generally not necessary.

I claim:

1. A method of making a semiconductor device comprising the steps of:

providing a semiconductor substrate with abutting regions of the same or opposite conductivity types, said regions extending to the surface of said substrate;

forming in at least one of said abutting regions a heavily doped region of the same conductivity type adjacent the interface with the other abutting region; and forming a trench in said substrate by removing portions of said substrate, said trench having at least a wall portion extending along said heavily doped region.

2. A method of making a semiconductor device comprising the steps of:

providing a semiconductor substrate with abutting regions of a first and second conductivity type;

forming a first masking layer over said semiconductor substrate;

forming an opening in said first masking layer over at least a portion of the interface of said abutting regions;

forming a second masking layer on at least a portion of said region of a first conductivity type exposed by said opening;

introducing dopants of a second conductivity type through said opening to form a heavily doped region of a second conductivity type, a portion of said heavily doped region of a second conductivity type extending under said first masking layer;

removing said second masking layer; and forming a trench in the regions of said semiconductor substrate which are not subtended by said first masking layer.

3. A method of making a semiconductor device in accordance with claim 2 further comprising the steps of:

thermally oxidizing the exposed walls of said trench; and filling said trench with an insulating material.

4. A method of making a semiconductor device in accordance with claim 3 wherein said trench is filled by chemically vapor depositing silicon dioxide.

5. A method of making a semiconductor device in accordance with claim 3 further comprising the step of:
   forming source and drain regions in said abutting regions.

6. A method of making a semiconductor device in accordance with claim 2 wherein the depth of said trench is less than the depth of the heavily doped region.

7. A method of making a semiconductor device in accordance with claim 2 wherein a first layer of silicon dioxide is grown on the surface of said substrate before said first masking layer is formed over said substrate.

8. A method of making a semiconductor device in accordance with claim 7 wherein said first masking layer is formed by depositing a silicon nitride layer on said first layer of silicon dioxide and then depositing a second layer of silicon dioxide on said silicon nitride layer.

9. A method of making a semiconductor device in accordance with claim 8 wherein the depth of the heavily doped region is less than or equal to the thickness of said first masking layer.

10. A method of making a semiconductor device in accordance with claim 2 wherein said heavily doped region is formed by using multiple ion beam implants.

11. A method of making a semiconductor device in accordance with claim 10 wherein the ion dose and implant energy are selected so that the heavily doped region has a substantially uniform doping density in said region of a second conductivity type where at least a portion of the side wall of said trench is located.

12. A method of making a semiconductor device in accordance with claim 2 further comprising the steps of:
   before removing said second masking layer, forming a trench in the regions of said semiconductor which are not subtended by said first and second masking layers; and
   introducing dopants of a second conductivity type through said opening to form a deeper heavily doped region of a second conductivity type.

13. A method of making a semiconductor device comprising the steps of:
   providing a semiconductor substrate with at least one active area containing abutting regions of a first and second conductivity type;
   covering a portion of the at least one active area with a first masking layer;
   forming a second masking layer on the exposed portions of the region of a first conductivity type within said at least one active area;
   introducing dopants of a second conductivity type into a portion of the semiconductor substrate to form a heavily doped region of a second conductivity type;
   removing said second masking layer;
   forming a trench in regions of said semiconductor substrate which are not subtended by said first masking layer, said trench having at least a wall portion extending along said heavily doped region; and
   filling said trench with an insulating material.

* * * * *